US012794462B2

(12) United States Patent
La Rosa

(10) Patent No.: US 12,794,462 B2
(45) Date of Patent: Nov. 10, 2026

(54) SYSTEMS AND METHODS FOR A TIME DOMAIN VOLTAGE REFERENCE WITH ZERO QUIESCENT CURRENT CONSUMPTION

(71) Applicant: STMicroelectronics International N.V., Geneva (CH)

(72) Inventor: Roberto La Rosa, Catania (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 38 days.

(21) Appl. No.: 18/944,674

(22) Filed: Nov. 12, 2024

(65) Prior Publication Data

US 2026/0135547 A1    May 14, 2026

(51) Int. Cl.

*H03K 5/14* (2014.01)
*H02M 3/157* (2006.01)
*H02M 3/158* (2006.01)
*H03K 5/131* (2014.01)
*H03K 5/00* (2006.01)

(52) U.S. Cl.

CPC .............. *H03K 5/14* (2013.01); *H02M 3/157* (2013.01); *H02M 3/158* (2013.01); *H03K 5/131* (2013.01); *H03K 2005/00065* (2013.01); *H03K 2005/00247* (2013.01)

(58) Field of Classification Search

CPC ......... H03K 5/14; H03K 5/131; H02M 3/157; H02M 3/158

See application file for complete search history.

(56) References Cited

U.S. PATENT DOCUMENTS 6,937,180 B1 * 8/2005 Muratov ............. H03M 1/0678 341/154
11,927,612 B1 3/2024 Knoll et al.
2014/0062551 A1 * 3/2014 Bhaumik .............. H03L 7/0814 327/158
2014/0084896 A1 3/2014 Zhang et al.
2014/0258764 A1 9/2014 Kwak
2014/0312961 A1 * 10/2014 Seo .......................... G11C 7/04 327/513
2020/0395849 A1 12/2020 Labbe et al.
2021/0373589 A1 12/2021 Shi et al.
2022/0100218 A1 3/2022 Jung et al.

* cited by examiner

*Primary Examiner* — Daniel C Puentes
(74) *Attorney, Agent, or Firm* — ALSTON & BIRD LLP

(57) ABSTRACT

Apparatuses, systems, and methods for a time domain voltage reference with zero quiescent current consumption are provided. An exemplary method includes outputting a first delay signal having a first delay that is based on an input voltage; outputting a second delay signal having a second delay that is based on a first voltage difference between the input voltage and an analog reference voltage; outputting first command signals that are based on a first time difference between the first delay and the second delay, wherein the first time difference corresponds to the first voltage difference; outputting a first counter signal indicative of a first value of a count of the counter, wherein the first value is based on the first command signals; and storing the first value, wherein a first programmable voltage delay line is configured to use the first value as a digital reference corresponding to the analog reference voltage.

20 Claims, 4 Drawing Sheets

SYSTEMS AND METHODS FOR A TIME DOMAIN VOLTAGE REFERENCE WITH ZERO QUIESCENT CURRENT CONSUMPTION

TECHNOLOGICAL FIELD

Example embodiments of the present disclosure relate generally to systems, apparatuses, and methods for a time domain voltage reference with zero quiescent current consumption.

BACKGROUND

Power conversion systems, such as low-dropout (LDO) regulators or switched-mode power supplies (SMPSs), rely on voltage references. Such voltage references may be associated with quiescent current consumption, which constrains the power performance of power conversion systems in low-power applications. For instance, some LDO designs rely on a voltage reference in combination with an operational amplifier or a comparator to regulate an output voltage. Such LDO designs are associated with quiescent current consumption due to the voltage reference (and the operational amplifier).

New systems and methods for a time domain voltage reference with reduced quiescent current consumption are needed. The inventors have identified numerous areas of improvement in the existing technologies and processes, which are the subjects of embodiments described herein. Through applied effort, ingenuity, and innovation, many of these deficiencies, challenges, and problems have been solved by developing solutions that are included in embodiments of the present disclosure, some examples of which are described in detail herein.

BRIEF SUMMARY

Various embodiments described herein relate to systems, apparatuses, and methods for a time domain voltage reference with zero quiescent current consumption.

In accordance with some embodiments of the present disclosure, an example system is provided. The example system comprises: a first programmable voltage delay line configured to output a first delay signal having a first delay that is based at least in part on an input voltage for the system; a second programmable voltage delay line configured to output a second delay signal having a second delay that is based at least in part on a first voltage difference between the input voltage and an analog reference voltage for the system; a phase detector configured to receive the first delay signal and the second delay signal and output a first one or more command signals based at least in part on a first time difference between the first delay and the second delay, wherein the first time difference corresponds to the first voltage difference; a counter configured to receive the first one or more command signals and output a first counter signal indicative of a first value of a count of the counter, wherein the first value is based at least in part on the first one or more command signals; and a storage element configured to store the first value, wherein the system is configured to use the first value as a digital reference corresponding to the analog reference voltage.

In some embodiments, the first programmable voltage delay line is configured to adjust the first delay in accordance with the first value, and wherein the storage element is configured to store the first value based at least in part on the adjusted first delay being equal to the second delay.

In some embodiments, the system comprises voltage reference circuitry configured to provide the analog reference voltage for the system, and wherein the system is configured to disable the voltage reference circuitry based at least in part on the adjusted first delay being equal to the second delay.

In some embodiments, at a time instance after disabling the voltage reference circuitry, the system is configured to enable the voltage reference circuitry based at least in part on the time instance satisfying a criterion.

In some embodiments, the counter is configured to adjust the count of the counter in accordance with the first one or more command signals, and wherein the first value is based at least in part on one or more adjustments to the count of the counter.

In some embodiments, the system comprises pass transistor circuitry configured to control an output voltage of the system, wherein the system is configured to provide one or more values of the counter to the pass transistor circuitry for controlling the output voltage based at least in part on the system operating in accordance with a regulation mode, and wherein the one or more values includes at least the first value.

In some embodiments, in accordance with the regulation mode: the first programmable voltage delay line is configured apply the digital reference to output a third delay signal having a third delay that is based at least in part on the analog reference voltage; the second programmable voltage delay line is configured to output a fourth delay signal having a fourth delay that is based at least in part on the output voltage; the phase detector is configured to receive the third delay signal and the fourth delay signal and output a second one or more command signals based at least in part on a second time difference between the third delay and the fourth delay, wherein the second time difference corresponds to a second voltage difference between the analog reference voltage and the output voltage; the counter is configured to receive the second one or more command signals and output a second counter signal indicative of a second value of the count of the counter, wherein the second value is based at least in part on the second one or more command signals; and the pass transistor circuitry is configured to activate a number of pass transistors included in the pass transistor circuitry in accordance with the second value, wherein the output voltage is based at least in part on the number of active pass transistors.

In some embodiments, the system is configured to provide a first one or more values of the counter to the first programmable voltage delay line to control the first delay based at least in part on the system operating in accordance with a calibration mode, wherein the first one or more values includes at least the first value, and wherein the system is configured to switch from the calibration mode to the regulation mode based at least in part on the first value satisfying a criterion.

In some embodiments, the system further comprises: a first n-channel metal oxide semiconductor transistor configured to provide a first voltage signal to the first programmable voltage delay line; wherein the first voltage signal is indicative of the input voltage; and a second n-channel metal oxide semiconductor transistor configured to provide a second voltage signal to the second programmable voltage delay line, wherein the second voltage signal is indicative of the first voltage difference.

In some embodiments, the storage element comprises a register or flash memory.

In some embodiments, the system comprises a voltage regulator, a direct current-to-direct current converter, or a switch mode power supply.

In accordance with some embodiments of the present disclosure, an example method is provided. The example method comprises outputting, via a first programmable voltage delay line, a first delay signal having a first delay that is based at least in part on an input voltage for a system; outputting, via a second programmable voltage delay line, a second delay signal having a second delay that is based at least in part on a first voltage difference between the input voltage and an analog reference voltage for the system; outputting, via a phase detector configured to receive the first delay signal and the second delay signal, a first one or more command signals that are based at least in part on a first time difference between the first delay and the second delay, wherein the first time difference corresponds to the first voltage difference; outputting, via a counter configured to receive the first one or more command signals, a first counter signal indicative of a first value of a count of the counter, wherein the first value is based at least in part on the first one or more command signals; and storing the first value via a storage element, wherein the first programmable voltage delay line is configured to use the first value as a digital reference corresponding to the analog reference voltage.

In some embodiments, the method comprises adjusting, via the first programmable voltage delay line, the first delay in accordance with the first value, wherein storing the first value is based at least in part on the adjusted first delay being equal to the second delay.

In some embodiments, the method comprises providing the analog reference voltage via a voltage reference circuitry; and disabling the voltage reference circuitry based at least in part on the adjusted first delay being equal to the second delay.

In some embodiments, the method comprises enabling the voltage reference circuitry at a time instance after disabling the voltage reference circuitry based at least in part on the time instance satisfying a criterion.

In some embodiments, the method comprises adjusting the count of the counter in accordance with the first one or more command signals, wherein the first value is based at least in part on one or more adjustments to the count of the counter.

In some embodiments, the method comprises outputting, based at least in part on the system operating in accordance with a regulation mode, one or more values of the counter to pass transistor circuitry for controlling an output voltage, wherein the one or more values includes at least the first value.

In some embodiments, the method comprises outputting, via the first programmable voltage delay line, a third delay signal having a third delay that is based at least in part on the analog reference voltage; outputting, via the second programmable voltage delay line, a fourth delay signal having a fourth delay that is based at least in part on the output voltage; outputting, via the phase detector, a second one or more command signals that are based at least in part on a second time difference between the third delay and the fourth delay, wherein the second time difference corresponds to a second voltage difference between the analog reference voltage and the output voltage; outputting, to the pass transistor circuitry via the counter, a second counter signal indicative of a second value of the count of the counter, wherein the second value is based at least in part on the second one or more command signals; and activating, via the pass transistor circuitry, a number of pass transistors in accordance with the second value, wherein the output voltage is based at least in part on the number of active pass transistors.

In some embodiments, the method comprises outputting, based at least in part on the system operating in accordance with a calibration mode, a first one or more values of the counter to the first programmable voltage delay line to control the first delay, wherein the first one or more values includes at least the first value; and switching from the calibration mode to the regulation mode based at least in part on the first value satisfying a criterion.

In some embodiments, the method comprises outputting, via a first n-channel metal oxide semiconductor transistor, a first voltage signal to the first programmable voltage delay line, wherein the first voltage signal is indicative of the input voltage; and outputting, via a second n-channel metal oxide semiconductor transistor, a second voltage signal to the second programmable voltage delay line, wherein the second voltage signal is indicative of the first voltage difference.

In some embodiments, the storage element comprises a register or flash memory.

In some embodiments, the system comprises a voltage regulator, a direct current-to-direct current converter, or a switch mode power supply.

In accordance with some embodiments of the present disclosure, an example apparatus is provided. The example apparatus comprises one or more programmable voltage delay lines, a phase detector, a counter, and at least one processor; and at least one memory having computer program code stored thereon that, in execution with the at least one processor, causes the apparatus at least to: output, via a first programmable voltage delay line of the one or more programmable voltage delay lines, a first delay signal having a first delay that is based at least in part on an input voltage for a system; output, via a second programmable voltage delay line of the one or more programmable voltage delay lines, a second delay signal having a second delay that is based at least in part on a first voltage difference between the input voltage and an analog reference voltage for the system; output, via the phase detector configured to receive the first delay signal and the second delay signal, a first one or more command signals that are based at least in part on a first time difference between the first delay and the second delay, wherein the first time difference corresponds to the first voltage difference; output, via the counter configured to receive the first one or more command signals, a first counter signal indicative of a first value of a count of the counter, wherein the first value is based at least in part on the first one or more command signals; and store the first value, wherein the first programmable voltage delay line is configured to use the first value as a digital reference corresponding to the analog reference voltage.

In at least one example embodiment, an apparatus is provided that comprises means for outputting, via a first programmable voltage delay line, a first delay signal having a first delay that is based at least in part on an input voltage for a system; outputting, via a second programmable voltage delay line, a second delay signal having a second delay that is based at least in part on a first voltage difference between the input voltage and an analog reference voltage for the system; outputting, via a phase detector configured to receive the first delay signal and the second delay signal, a first one or more command signals that are based at least in part on a first time difference between the first delay and the second delay, wherein the first time difference corresponds to the first voltage difference; outputting, via a counter configured to receive the first one or more command signals, a first counter signal indicative of a first value of a count of the counter, wherein the first value is based at least in part on the first one or more command signals; and storing the first value via a storage element, wherein the first programmable voltage delay line is configured to use the first value as a digital reference corresponding to the analog reference voltage.

The above summary is provided merely for purposes of summarizing some example embodiments to provide a basic understanding of some aspects of the disclosure. Accordingly, it will be appreciated that the above-described embodiments are merely examples and should not be construed to narrow the scope or spirit of the disclosure in any way. It will also be appreciated that the scope of the disclosure encompasses many potential embodiments in addition to those summarized here, some of which will be further described below.

BRIEF SUMMARY OF THE DRAWINGS

Figure 1A:
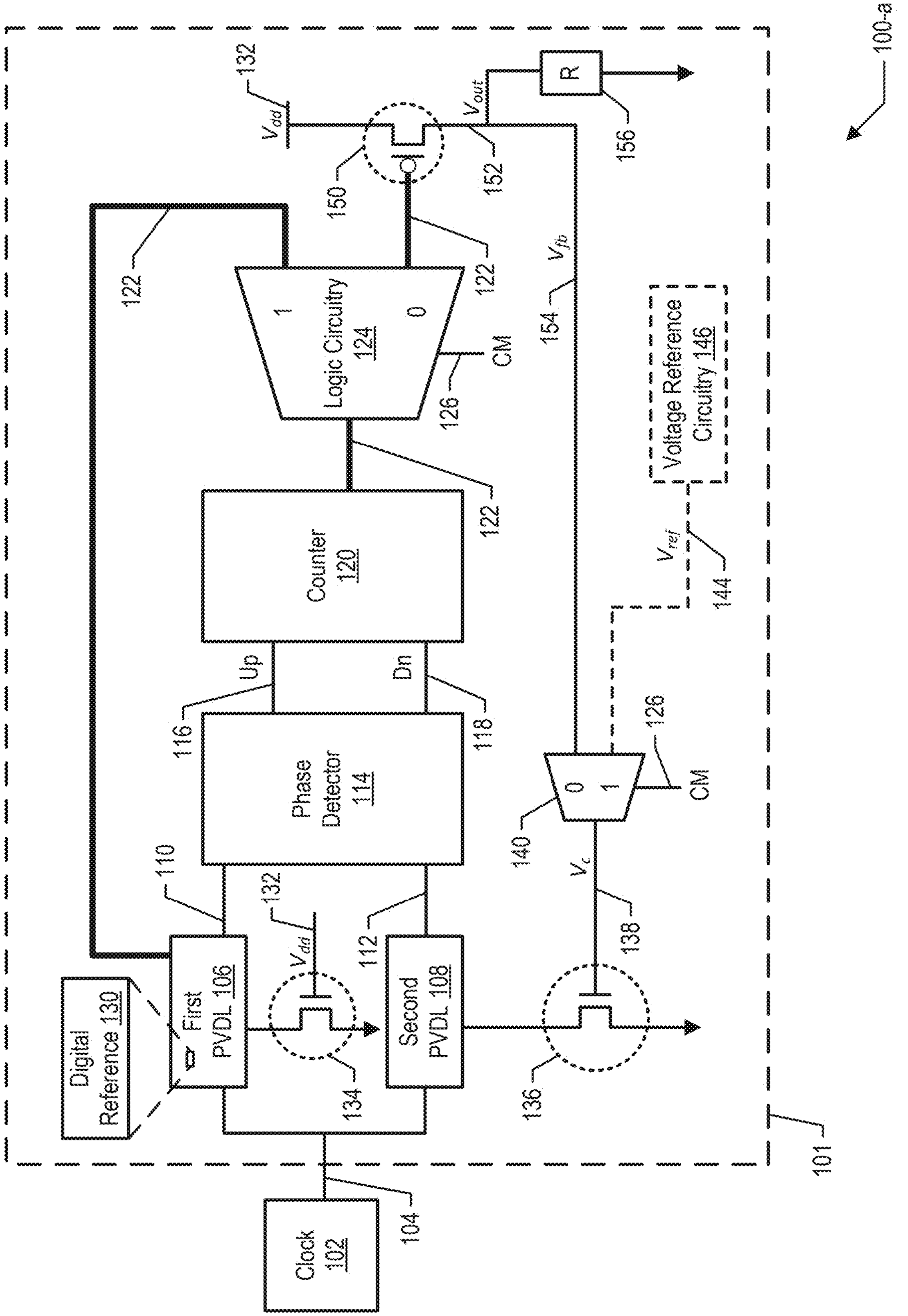
Figure 1B:
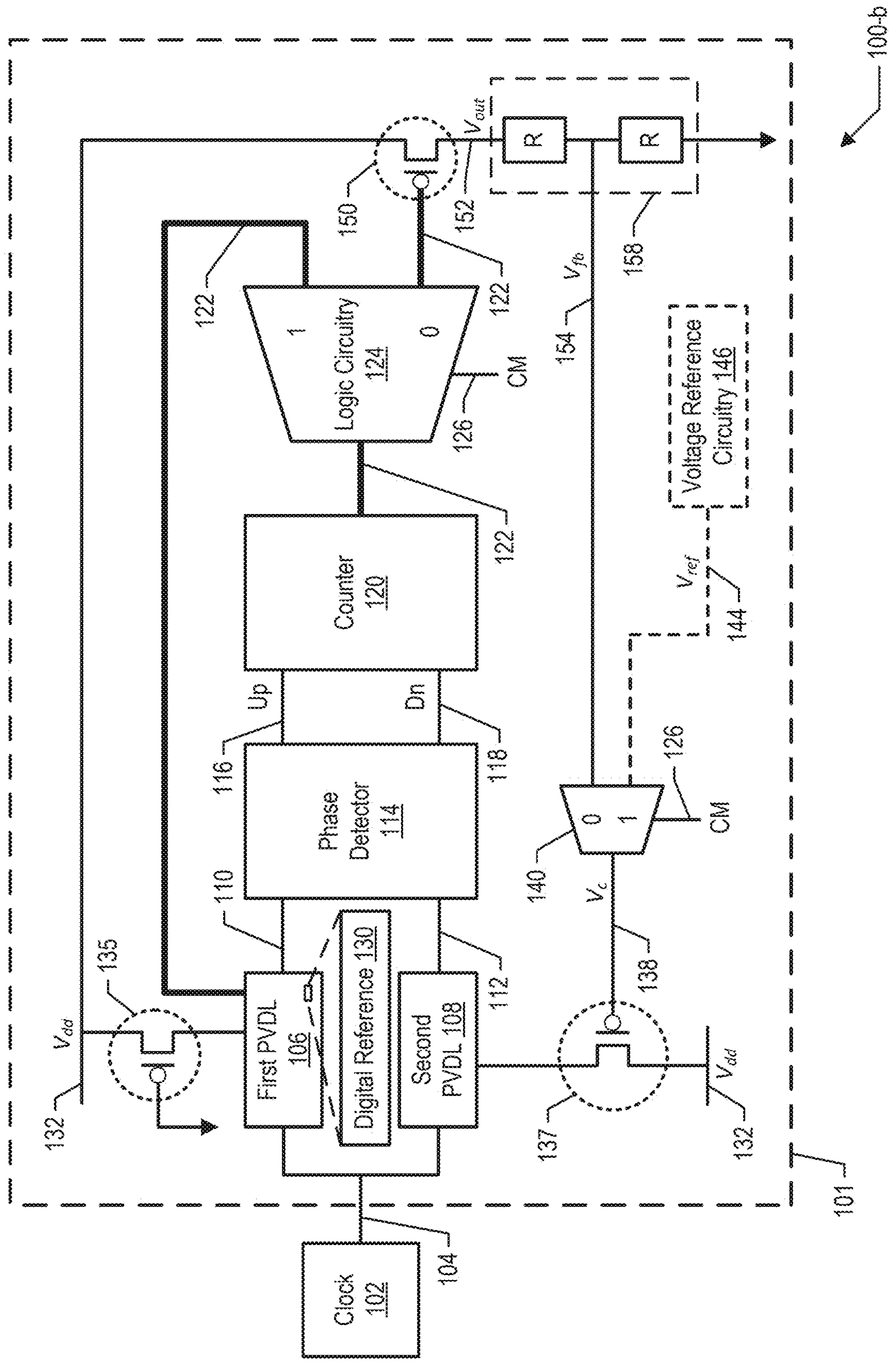
Figure 2:
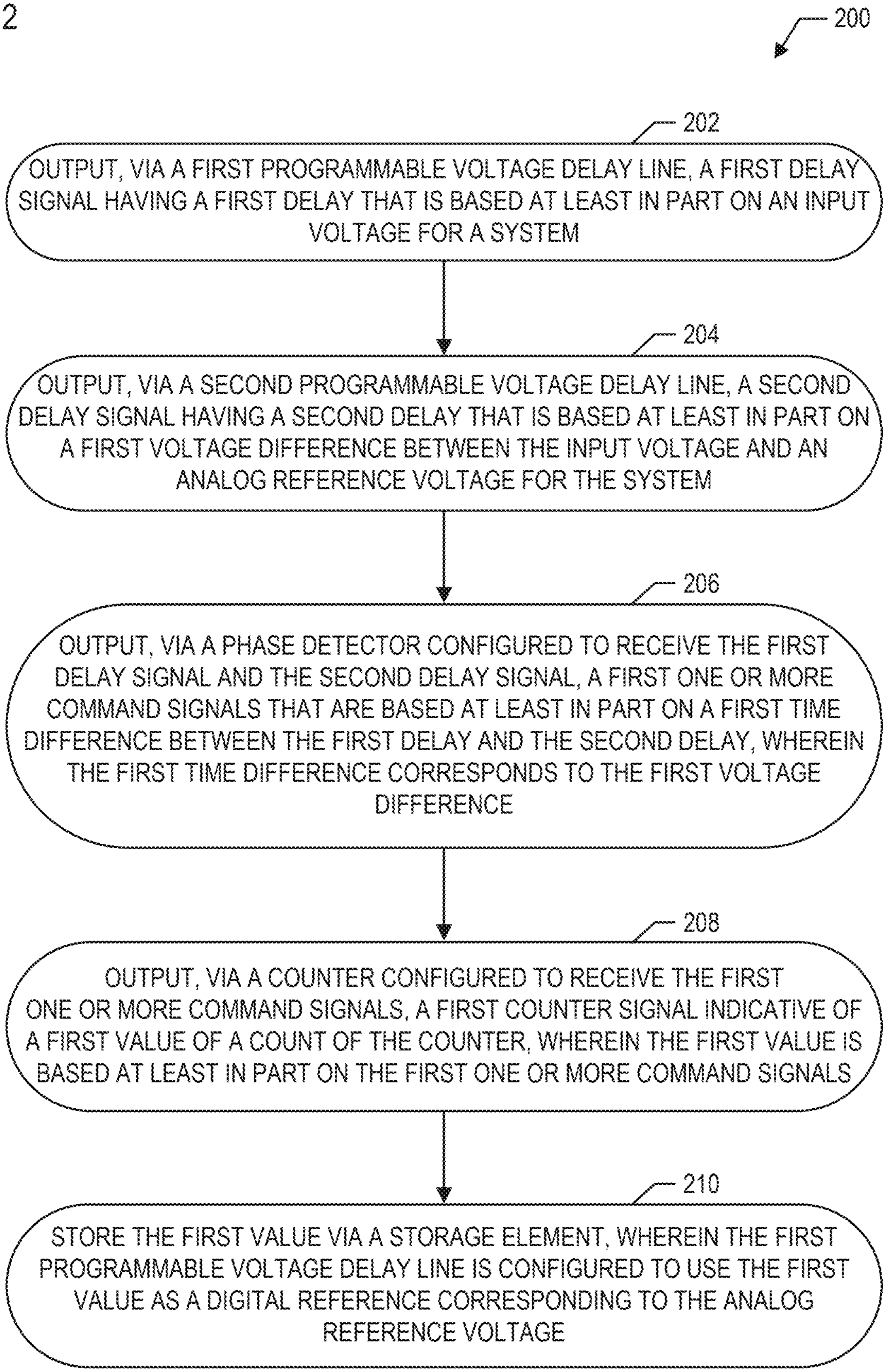
Figure 3:
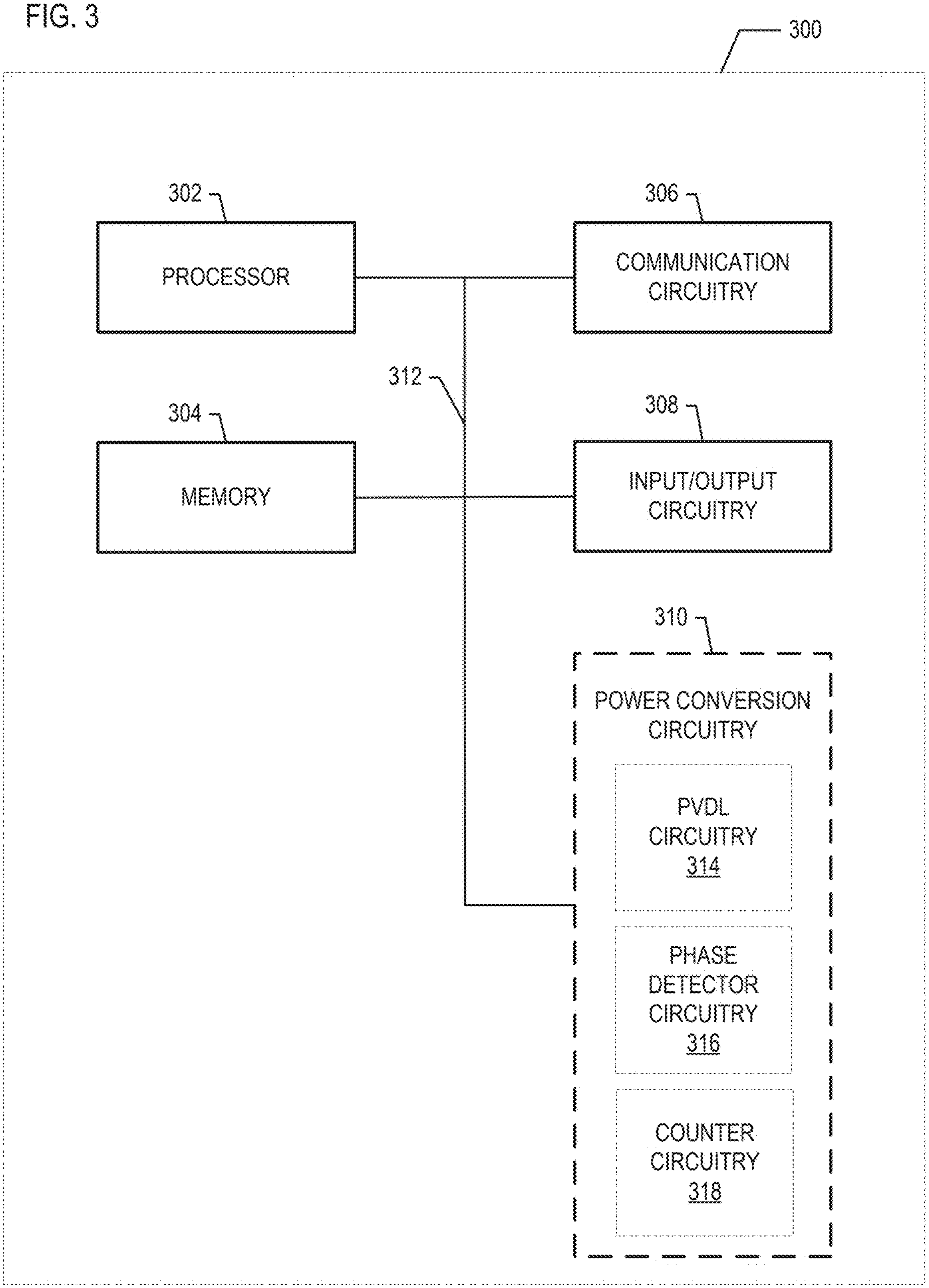

Having thus described certain example embodiments of the present disclosure in general terms, reference will now be made to the accompanying drawings, which are not necessarily drawn to scale, and wherein:

FIGS. 1A and 1B illustrate exemplary diagrams of a system configured for a time domain voltage reference with zero quiescent current consumption in accordance with one or more embodiments of the present disclosure;

FIG. 2 illustrates a flowchart of operations that support systems and methods for a time domain voltage reference with zero quiescent current consumption in accordance with one or more embodiments of the present disclosure; and FIG. 3 illustrates an exemplary device that support systems and methods for a time domain voltage reference with zero quiescent current consumption in accordance with one or more embodiments of the present disclosure.

DETAILED DESCRIPTION

Some embodiments of the present disclosure will now be described more fully herein with reference to the accompanying drawings, in which some, but not all, embodiments of the disclosure are shown. Indeed, various embodiments of the disclosure may be embodied in many different forms and should not be construed as limited to the embodiments set forth herein; rather, these embodiments are provided so that this disclosure will satisfy applicable legal requirements. Like reference numerals refer to like elements throughout.

As used herein, the term "comprising" means including but not limited to and should be interpreted in the manner it is typically used in the patent context. Use of broader terms such as comprises, includes, and having should be understood to provide support for narrower terms such as consisting of, consisting essentially of, and comprised substantially of.

The phrases "in various embodiments," "in one embodiment," "according to one embodiment," "in some embodiments," and the like, generally mean that the particular feature, structure, or characteristic following the phrase may be included in at least one embodiment of the present disclosure and may be included in more than one embodiment of the present disclosure (importantly, such phrases do not necessarily refer to the same embodiment).

The word "example" or "exemplary" is used herein to mean "serving as an example, instance, or illustration." Any implementation described herein as "exemplary" is not necessarily to be construed as preferred or advantageous over other implementations.

If the specification states a component or feature "may," "can," "could," "should," "would," "preferably," "possibly," "typically," "optionally," "for example," "often," or "might" (or other such language) be included or have a characteristic, that a specific component or feature is not required to be included or to have the characteristic. Such a component or feature may be optionally included in some embodiments or it may be excluded.

The use of the term "circuitry" as used herein with respect to components of a system or an apparatus should be understood to include particular hardware configured to perform the functions associated with the particular circuitry as described herein. The term "circuitry" should be understood broadly to include hardware and, in some embodiments, software for configuring the hardware. For example, in some embodiments, "circuitry" may include processing circuitry, communications circuitry, input/output circuitry, and the like. In some embodiments, other elements may provide or supplement the functionality of particular circuitry.

The term "analog reference voltage," as used herein with respect to circuitry or components therefore in a system or an apparatus, means an analog signal against which another analog signal is compared. For example, an analog reference voltage may be compared to an incoming analog signal (as in an analog-to-digital converter (ADC)) or an outgoing analog signal (as for a digital-to-analog converter (DAC)). An analog reference voltage may be substantially consistent (e.g., stable) irrespective of changes in ambient temperature, loading, input supply, and time. A system or an apparatus may use an analog reference voltage to improve an accuracy and repeatability of data conversion by the system.

The term "analog voltage reference circuitry," as used herein with respect to circuitry or components thereof in a system or an apparatus, means circuitry configured to produce an output voltage (e.g., an analog reference voltage), which is substantially consistent (e.g., stable) irrespective of changes in ambient temperature, loading, input supply, and time. In some non-limiting examples, analog voltage reference circuitry includes series reference circuitry or shunt reference circuitry.

The term "digital reference," as used herein with respect to circuitry or components therefore in a system or an apparatus, means a digital value that corresponds to a number representing an analog reference voltage.

The term "closed loop," and the like, as used herein with respect to circuitry or components therefore in a system or an apparatus, means circuitry that includes a feedback loop and is capable of monitoring and/or adjusting functionality of the circuitry based on the output of the circuitry.

Overview

Power conversion applications seek improved voltage regulators. In particular, power conversion applications seek voltage regulation methods and systems with a voltage reference having zero or near-zero quiescent current consumption. For example, power conversion systems, such as low-dropout (LDO) regulators or switched-mode power supplies (SMPS), may rely on analog voltage references to achieve accurate and repeatable power conversion. Such analog voltage references, however, are associated with various challenges. For example, analog voltage references are associated with quiescent current consumption that constrains (e.g., limits) the power performance in low- or ultra-low-power applications. Additionally, for low voltage integrated circuit processes, designing and implementing an analog voltage reference (e.g., a voltage reference with an architecture based on the voltage domain) is relatively difficult. For example, analog LDO designs may regulate a voltage (e.g., achieve 0 voltage error) by using a voltage loop to increase the gain of an operational amplifier. That is, analog LDOs may use an analog voltage reference and an operational amplifier in a closed loop to regulate an output voltage. Consequently, in such analog LDOs, the quiescent current consumption cannot be zero since some current is consumed by the operational amplifier, as well as the voltage reference circuitry used to produce the analog voltage reference used by the operational amplifier.

Additionally, analog components may be more complex than digital logic and, as such, may be relatively time consuming to design and implement. Moreover, circuits are moving towards transistors with lower channel lengths and, as channel lengths decrease, the operating voltage of the system may also decrease, which may degrade the performance of analog LDOs. That is, the performance of analog LDPs may degrade at relatively low operating voltages. Thus, working in the voltage domain is becoming increasingly more difficult as the available voltage headroom in deep-submicron silicon design processes decreases. As such, voltage domain-based architectures may not be suitable for deep-submicron processes (e.g., at 18 nm and below).

Digital LDOs may be easier to design and implement than analog LDOs. Additionally, digital LDOs may operate at lower voltages than analog LDOs. However, some digital LDOs rely on analog voltage references. For example, some digital LDOs may use an analog voltage reference and a comparator (in addition to control logic) to regulate the output voltage. Thus, the quiescent current consumption in such digital LDOs cannot be zero since some current is consumed by the voltage reference circuitry used to produce the analog voltage reference used by the comparator.

Various aspects of the present disclosure are directed to improved systems, apparatuses, and methods for a time domain voltage reference with zero (or near-zero) quiescent current consumption. Among other aspects, the present disclosure provides improved systems, apparatuses, and methods for an improved digital LDO with an innovative digital time domain reference. For example, to address the challenges posed by deep-submicron silicon design processes for integrated circuits, the present disclosure provides a time-domain voltage reference technique, which may be utilized instead of a voltage-domain technique.

In accordance with the present disclosure, an analog reference voltage is converted into a number that is stored and used for regulating an output voltage of a system or apparatus. For example, a system may be configured to convert a voltage difference between an analog reference voltage ($V_{ref}$) and an input voltage ($V_{dd}$) into a time difference. The system may then use the value of the time difference as a digital reference to maintain a zero voltage difference between $V_{ref}$ and $V_{dd}$. In other words, the system is configured to remodulate the voltage difference between $V_{ref}$ and $V_{dd}$ as a time difference, which is managed by the system.

By converting the voltage difference into a time difference, the system may digitize the difference and store the difference as a digital number, thereby creating a digital reference that may replace the analog voltage reference. The digital reference does not consume quiescent current, resulting in a voltage reference with zero quiescent current consumption. In other words, the quiescent current consumption of the system may be zero since no current is consumed by voltage reference circuitry (or other associated circuitry, such as an operational amplifier, which is used in some analog LDO designs).

In some examples, the systems and apparatus of the present disclosure may include a first programmable voltage delay line (PVDL) that is driven by an input voltage (also referred to as a source voltage). In some such examples, the first PVDL is configured to receive a clock signal and output a first delay signal with a first delay ($\Delta t_a$) that depends on the input voltage ($V_{dd}$). For example, the first delay may be inversely proportional to $V_{dd}$. The system may also include a second PVDL that is driven, in part, by a control voltage ($V_c$). In some examples, the second PVDL is configured to receive the clock signal and output a second delay signal with a second delay ($\Delta t_b$) that depends on the control voltage. For example, the second delay may be inversely proportional to a voltage difference between $V_{dd}$ and $V_c$.

In accordance with a calibration mode (CM), the control voltage may correspond to an analog reference voltage ($V_{ref}$). That is, the control voltage may be the analog reference voltage or may be otherwise indicative of the analog reference voltage. For example, the system may include a multiplexer that is configured to receive the analog reference voltage. In the calibration mode, an input to the multiplexer may be set to '1', which may cause the multiplexer to output the received analog reference voltage. In other words, to calibrate the system, the multiplexer is set to '1', such that the control voltage is equal to the analog reference voltage. Accordingly, in the calibration mode, the second delay may be inversely proportional to a voltage difference between $V_{dd}$ and $V_{ref}$.

In some examples, the system includes a phase detector configured to receive the first delay signal and the second delay signal from the first PVDL and the second PVDL, respectively. In some such examples, the phase detector may determine whether the first delay signal is in phase with the second delay signal. For example, the phase detector may be configured to detect a difference between the first delay signal and the second delay signal and output one or more command signals to a counter based on the detected difference. The one or more command signals may trigger the counter to count forward or backwards.

For example, the phase detector may determine that the first delay is smaller than the second delay. In such an example, based on the first delay being smaller than the second delay, the phase detector may output a first command signal (referred to herein as an 'Up' signal) with a value set to '1'. Additionally, or alternatively, the phase detector may output a second command signal (referred to herein as a 'Dn' signal) with a value set to '0'. The first command signal being set to '1' and/or the second command signal being set to '0' may trigger the counter to count forward (e.g., increment the count of the counter by 1).

In some examples, the counter is configured to output a counter signal to logic circuitry. The counter signal may indicate one or more bits representative of a value (e.g., integer) of the count of the counter. In accordance with the calibration mode, an input to the logic is set to '1', which may cause the logic to output the counter signal to the first PVDL. The first PVDL may adjust (e.g., increase) the first delay according to the value of the counter. In some examples, the first PVDL may use the value of the counter to determine a quantity of clock cycles at which to delay the first signal. Accordingly, as the value of the counter increase, the value of the first delay also increases.

In some embodiments, in accordance with the calibration mode, the system may be configured to iteratively increase or decrease the count of the counter (and thus the first delay) until the value of the first delay is equal to the value of the second delay (e.g., until $\Delta t_a = \Delta t_b$). That is, the phase detector may (continue to) trigger the counter to count forward until the value of the first delay is equal to the value of the second delay (e.g., until no difference is detected between the first delay and the second delay). As an illustrative example, if an initial difference between $\Delta t_a$ and $\Delta t_b$ is 1 second and each increment of the counter corresponds to 1 millisecond (e.g., due to the period of the clock cycle being 1 millisecond), then $\Delta t_a$ may be equal to $\Delta t_b$ when the value of the counter is 1000. In other words, when the value of the counter is 1000, the first PVDL may increase the first delay of the first delay signal by 1000 clock cycles (or 1 second), such that the value of the first delay is equal to the value of the second delay and the first delay signal is in phase with the second delay signal. In some examples, based on the first delay signal being in phase with the second delay signal, the phase detector may fail to detect a difference between the first delay and the second delay and, as such, may refrain from triggering the counter to count forward (or backward). The phase detector may refrain from triggering the counter to count forward (or backward) by refraining from outputting the first command signal and the second command signal. Alternatively, the phase detector may refrain from triggering the counter to count forward (or backward) or the phase detector may set the first command signal and the second command signal to '0.' In such an example, the lack of the command signals, or the first command signal and the second command signal being set to '0', may cause the value of the counter to remain at 1000, such that the value of the first delay remains equal to the value of the second delay. Thus, by performing the calibration, the system may obtain a zero time difference between the first delay signal and the second delay signal despite a voltage difference between Vad and $V_{ref}$. In other words, by performing the calibration, the system may compensate for a voltage difference between $V_{dd}$ and $V_{ref}$.

In some examples, the system may store the value of the counter and/or the value of the first delay in response to the first delay signal being in phase with the second delay signal. In other words, when the system reaches a lock (e.g., when $\Delta t_a = \Delta t_b$), the system may store a digital value of the analog voltage reference (e.g., in the form of one or more bits corresponding to the value of the count of the counter). Accordingly, after the calibration, the analog voltage reference may be turned off or otherwise disabled. In other words, during the calibration, the analog reference voltage is converted into a number that is stored for subsequent use by the system. The number may be stored in flash memory or a register, such as a register for the first PVDL.

In some examples, the calibration is performed during a test prior to deployment. Accordingly, in some such examples, the system may be integrated into a device without analog voltage reference circuitry, which may reduce a quantity of current consumed by the system. That is, by integrating the system into the device without the analog voltage reference circuitry, the system may achieve zero current consumption since no current is consumed by the analog reference voltage circuitry.

In some other examples, the system may be integrated into the circuit with the analog voltage reference circuitry. In some such examples, the system may use the analog voltage reference circuitry while operating in accordance with the calibration mode and may disable the analog voltage reference circuitry while operating in accordance with a regulation mode. In other words, the system may use the analog voltage reference circuitry to perform one or more calibrations and may disable (e.g., turn off) the analog voltage reference circuitry after the one or more calibrations are complete (e.g., after $\Delta t_a = \Delta t_b$). In such examples, by disabling the analog voltage reference circuitry after performing the one or more calibrations, the system may achieve zero or near-zero current consumption since no current is consumed by the analog reference voltage circuitry during operations in accordance with the regulation mode. In some examples, the system may determine to perform a calibration once, such as prior to deployment or upon start-up of the system. In some other examples, the system may perform a calibration at start-up and at one or more other time instances after start-up. For example, the system may perform a calibration periodically (or a periodically), based on one or more criteria. The one or more criteria may include an expiration of a timer corresponding to an operating time of the system (e.g., a time since the system was initialized) and/or an expiration of a timer corresponding to a previous calibration (e.g., a time since a previous calibration was performed).

In some embodiments, the system may be configured to transition from the calibration mode to the regulation mode in response to determining that the first delay signal is in phase with the second delay signal. That is, when the system reaches a lock (e.g., when $\Delta t_a = \Delta t_b$), the system may switch (e.g., autonomously) from the calibration mode to the regulation mode. For example, an input to the logic circuitry (and the multiplexer) may switch from '1' to '0'. In some examples, the logic circuitry may determine to switch from the calibration mode to the regulation mode in response to the counter maintaining (and therefor indicating via the clock signal) the same count value for a particular duration.

In some examples, in accordance with the regulation mode, the logic circuitry may output the counter signal to pass transistor circuitry (e.g., a set of one or more pass transistors). For example, when the input to the logic circuitry is set to '0' the logic circuitry may use the counter signal to drive (e.g., activate) a number of pass transistors included in the pass transistor circuitry. Additionally, the multiplexer may be configured to receive a feedback signal ($V_{fb}$) from the pass transistor circuitry, in which the feedback signal corresponds to an output voltage ($V_{out}$) for the system. In some examples, when the input to the multiplexer is set to '0', the multiplexer may be configured to output the feedback signal. In other words, in the regulation mode, the multiplexer is set to '0' such that the control voltage ($V_c$) is equal to the feedback voltage and the second delay is inversely proportional to a difference between the input voltage and the feedback voltage. Consequently, if the feedback voltage (and thus the output voltage) deviates from the reference voltage, the phase detector may determine that the first delay signal and the second delay signal are out of phase and, as such, may trigger the counter to count forward or backwards (e.g., to compensate for the voltage difference between the feedback voltage and the reference voltage).

For example, $V_{fb}$ may be greater than $V_{ref}$. In such an example, the first delay will be smaller than the second delay and, as such, the phase detector may trigger the counter to count forward. For example, the phase detector may set the first control signal to '1' and the second control signal to '0' to trigger the counter to count forward. In some examples, by increasing the value of the counter, the system may decrease the number of active pass transistors in the pass transistor circuitry, thereby decreasing the output voltage.

The phase detector may (continue to) trigger the counter to count forward until the second delay signal is in phase with the first delay signal (e.g., until $\Delta t_a = \Delta t_b$). In other words, the phase detector may trigger the counter to count forward until a value of the feedback voltage is equal to the value of the reference voltage.

In some other examples, $V_{fb}$ may be less than $V_{ref}$. In such examples, the first delay will be larger than the second delay and, as such, the phase detector may trigger the counter to count backward. For example, the phase detector may set the first command signal to '0' and the second command signal to '1' to trigger the counter to count backward. In some examples, by decreasing the value of the counter, the system may increase the number of active pass transistors in the pass transistor circuitry, thereby increasing the output voltage. The phase detector may (continue to) trigger the counter to count backwards until $\Delta t_a = \Delta t_b$. In other words, the phase detector may trigger the counter to count backward until the first delay signal is in phase with the second delay signal (e.g., until $\Delta t_a = \Delta t_b$). In other words, the phase detector may trigger the counter to count backward until a value of the feedback voltage is equal to the value of the reference voltage.

In some examples, the first PVDL and the second PVDL are driven by a respective N-channel metal-oxide semiconductor (NMOS) transistors. In some such examples, by using NMOS transistors to drive the first PVDL and the second PVDL, the system may lack (e.g., avoid using) a resistor divider, which is a source of leakage. In some other examples, the first PVDL and the second PVDL are driven by a respective P-channel metal-oxide semiconductor (PMOS) transistor.

By providing for a time domain voltage reference with zero quiescent current consumption, the systems, apparatuses, and methods may improve the power performance of voltage regulators, among other benefits. For example, the time domain voltage reference with zero quiescent current consumption, as described herein, may include a more efficient and effective circuit designs in low voltage environments.

Exemplary Systems, Methods, and Apparatuses

Embodiments of the present disclosure herein include systems, methods, and apparatuses for a time domain voltage reference with zero quiescent current consumption, which may be implemented in various embodiments.

FIGS. 1A and 1B illustrate exemplary diagrams 100-*a* and 100-*b*, respectively, of a system configured for a time domain voltage reference with zero (or near-zero) quiescent current consumption in accordance with one or more embodiments of the present disclosure.

Analog circuits, such as those that include an operational amplifier, are based on the voltage domain. For example, some such analog circuits regulate an output voltage by using a voltage loop, and the gain of an operational amplifier, to achieve near-zero voltage error between an analog output voltage signal and an analog reference voltage signal. In some such examples, the analog circuits may be associated with quiescent current consumption, which may constrain (e.g., limit) the performance of the device, for example, in low- or ultra-low-power applications. As used herein, quiescent current consumption refers to current consumed by circuitry in a low-power state. For example, quiescent current may include current drawn by a device (e.g., such as a direct current-to-direct current (DC-DC) converter utilizing an analog reference voltage and an operation amplifier) over durations in which the device is not switching and/or is not coupled to a load. In some examples, quiescent current may also be referred to as standby current and/or sleep mode current. Accordingly, in some examples, quiescent current consumption may also be referred to herein as static power consumption.

Additionally, analog components in a circuit may be relatively complex and time consuming to design and implement compared to digital logic. Additionally, analog components in a circuit may become increasingly more difficult to implement as complementary metal oxide semiconductor (CMOS) technologies move towards shorter channel lengths. For example, as channel lengths decrease, source voltages also decrease. Accordingly, CMOS technologies may move toward shorter channel lengths to accommodate lower source voltages and achieve smaller circuits with faster processing (e.g., faster current flow, quicker switching between states). However, the threshold voltage of a transistor (e.g., the gate voltage at which substantial current starts to flow from the source to the drain) may not scale with source voltage and reductions in the threshold voltage may lead to increases in leakage current, which may increase power consumption and negatively impact battery life. Accordingly, designing high-performance analog circuitry may be increasingly more difficult as CMOS channel lengths decrease.

A time domain voltage reference with zero quiescent current consumption, as described herein, provides a framework for converting a voltage difference between an analog voltage reference and an input voltage into a time difference and storing the time difference as a digitized number, which creates a digital reference that replaces the analog voltage reference. By replacing the analog voltage reference with the digital reference, the systems and methods described herein provide for reduced (e.g., zero or near-zero) quiescent current consumption. In other words, as illustrated in the example of FIG. 1A and FIG. 1B, a circuit may be configured to support a time domain voltage reference to achieve reduced (e.g., zero or near-zero) quiescent current. As used herein, the term near-zero quiescent current means a negligible quantity of quiescent current.

The diagram 100-*a* and the diagram 100-*b* illustrate examples of a power conversion system, such as an LDO regulator. The power conversion systems of FIGS. 1A and 1B include a power conversion circuitry 101. The power conversion circuitry 101 may include transistor circuitry 150, which may include a set of one or more pass transistors. In some examples, the transistor circuitry 150 includes pass transistor logic (PTL). The transistor circuitry 150 may provide an output voltage 152 ($V_{out}$) to a load 156 (as in FIG. 1A) or a load 158 (as in FIG. 1B).

Variations in temperature, load, or a source voltage, among other factors, may impact an output voltage of a circuit. The power conversion circuitry 101 may be configured to adjust the transistor circuitry 150 to compensate for variations in the output voltage 152, such as may be caused by variations in temperature, load, or a source voltage 132 ($V_{dd}$). For example, the power conversion circuitry 101 may determine to provide the load 156 or the load 158 with the output voltage 152 having a first value. The power conversion circuitry 101 may adjust a number of active pass transistors in the transistor circuitry 150 to maintain the first value for the output voltage 152 irrespective of variations in the temperature, load, or the source voltage 132. In other words, the power conversion circuitry 101 may adjust the number of active pass transistors in the transistor circuitry 150 to maintain a consistent output voltage (e.g., a relatively similar value for the output voltage 152) irrespective of changes to the temperature, load, or source voltage.

Power conversion systems, such as LDOs, may use a voltage reference to maintain a consistent output voltage. Some such power conversion systems may use an analog voltage reference as the voltage reference to maintain a consistent output voltage. However, analog voltage references are associated with a static power consumption (e.g., quiescent power consumption), which may impact a performance of the power conversion system.

To reduce quiescent current consumption, systems and methods described herein provide for a digital reference 130, which the power conversion circuitry 101 may use (e.g., instead of an analog voltage reference) as the voltage reference for maintaining the output voltage 152. Advantages of using the digital reference 130 include, for example, reduced (e.g., zero or near-zero) static power consumption and negligible leakage. Additionally, digital circuits, such as those illustrated in the examples of FIGS. 1A and 1B, may be easier, faster, and less expensive to implement than analog circuits. For example, the digital structure illustrated by the diagrams 100 are synthesizable. That is, developers may write behavioral code (e.g., the register transfer level (RTL)) for the structure and then use the behavioral code to synthesize the systems of FIG. 1A and FIG. 1B. In some such examples, the developers may reprogram the code (e.g., to reshape the structure) relatively easily.

To obtain the digital reference 130, the power conversion circuitry 101 may be configured to convert a voltage difference between a reference voltage 144 ($V_{ref}$) and the source voltage 132 ($V_{dd}$) into a time difference, which the power conversion circuitry 101 may use to maintain a zero (or near-zero) voltage difference between the reference voltage 144 and the output voltage 152 (a controlling voltage). In other words, the power conversion circuitry 101 (e.g., a voltage regulator) remodulates the voltage difference as a time difference and manages the time difference to maintain a consistent value for the output voltage 152.

The power conversion circuitry 101 includes a first PVDL 106 and a second PVDL 108. The first PVDL 106 and the second PVDL 108 may be examples of PVDLs that are configured to delay an input signal using a digital control (e.g., a control word). The first PVDL 106 and the second PVDL 108 may vary the delay in discrete steps (e.g., increments or decrements) based on the control word. In some examples, the size of an increment or decrement may vary based on a period of the input signal.

In some examples, the first PVDL 106 is driven by the source voltage 132. For example, the first PVDL 106 may be coupled to a first transistor configured to provide the first PVDL 106 with the source voltage 132. The second PVDL 108 may be driven, in part, by a control voltage 138 ($V_C$). For example, the second PVDL 108 may be coupled to a second transistor configured to provide the second PVDL 108 with a voltage corresponding to a difference between the source voltage 132 and the control voltage 138.

In the example of FIG. 1A, the first PVDL 106 and the second PVDL 108 may be driven by a respective NMOS transistor. For example, the first PVDL 106 is coupled to (and driven by) a first NMOS transistor 134 and the second PVDL 108 is coupled to (and driven by) a second NMOS transistor 136. In such an example, by using a first NMOS transistor 134 and the second NMOS transistor 136 to drive the first PVDL 106 and the second PVDL 108, respectively, the system may lack (e.g., avoid using) a resistor divider, which is a source of leakage.

In the example of FIG. 1B, the first PVDL and the second PVDL are driven by a respective PMOS transistor. For example, the first PVDL 106 is coupled to (and driven by) a first PMOS transistor 135 and the second PVDL 108 is coupled to (and driven by) a second PMOS transistor 137. In such an example, the load 158 may include a resistor divider.

The first PVDL 106 and the second PVDL 108 may be configured to receive a clock signal 104 from a clock 102. For example, the power conversion circuitry 101 may be coupled to the clock 102. In some examples, the clock 102 may be an example of a clock for a device (e.g., a microcontroller), which may include the power conversion circuitry 101. For example, the power conversion circuitry 101 may be an example of an LDO included in (or otherwise coupled to) a microcontroller. As such, the systems of FIG. 1A and FIG. 1B may use the clock 102 of the microcontroller (e.g., once) to control the LDO.

In response to receiving the clock signal 104, the first PVDL 106 may output a first delay signal 110, with a first delay ($\Delta t_a$) that depends on the source voltage 132 ($V_{dd}$). In other words, the first PVDL 106 is configured to output the first delay signal 110 having a first delay that is based on an input voltage (e.g., the source voltage 132) for the power conversion circuitry 101. In some examples, a value of the first delay may be determined in accordance with the following Equation 1:

$$\Delta t_a = \frac{K}{V_{dd}} \tag{1}$$

where K is a constant. The value of K may be based on one or more parameters associated with the systems of FIGS. 1A and 1B. As illustrated in Equation 1, the first delay ($\Delta t_a$) may be inversely proportional to the source voltage 132 ($V_{dd}$).

In response to receiving the clock signal 104, the second PVDL 108 may output a second delay signal 112, with a second delay ($\Delta t_b$) that depends on the control voltage 138 (e.g., and the source voltage 132 ($V_{dd}$)). In other words, the second PVDL 108 is configured to output the second delay signal 112 having a second delay that is based on a voltage difference between the input voltage and the control voltage 138 ($V_c$). In some examples, a value of the second delay may be determined in accordance with the following Equation 2:

$$\Delta t_b = \frac{K}{V_{dd} - V_c} \tag{2}$$

Thus, as illustrated in Equation 2, the second delay ($\Delta t_b$) may be inversely proportional to a difference between the source voltage 132 ($V_{dd}$) and the control voltage 138. As such, the first delay signal 110 and the second delay signal 112 may have the same delay (e.g., may be in phase) for examples in which the source voltage 132 is equal to the control voltage 138 (e.g., $\Delta t_a = \Delta t_b$ for $V_{dd} = V_c$). The first delay signal 110 and the second delay signal 112 may have different delays (e.g., may be out of phase) for examples in which the source voltage 132 is different from the control voltage 138 (e.g., $\Delta t_a \# \Delta t_b$ for $V_{dd} \# V_c$). In some examples, the source voltage 132 corresponds to a relatively large voltage (e.g., the largest voltage in the power conversion circuitry 101) and the control voltage 138 ($V_c$) corresponds to a relatively small voltage (e.g., a steady state voltage for the power conversion circuitry 101). Accordingly, in some such examples, the source voltage 132 may be larger than the control voltage 138 and, as such, the value of the first delay may be smaller than the value of the second delay (e.g., $\Delta t_a < \Delta t_b$ for $V_{dd} > V_c$). In some other examples, the value of the first delay may be larger than the value of the second delay (e.g., $\Delta t_a > \Delta t_b$ for $V_{dd} < V_c$).

In some examples, the power conversion circuitry 101 may be configured to operate in accordance with a calibration mode. For example, in accordance with the calibration mode, a CM signal 126, which is provided to a multiplexer 140 and logic circuitry 124, may be set to 1. By setting the CM signal 126 to a first value (e.g., '1') the multiplexer 140 may be configured to output a reference voltage 144 ($V_{ref}$) provided by a voltage reference circuitry 146. Thus, in accordance with the calibration mode, the control voltage 138 is equal to the reference voltage 144 and the second delay is based on a first voltage difference between the source voltage 132 (e.g., an input voltage to the power conversion circuitry 101) and the reference voltage 144 (e.g., an analog reference voltage for the power conversion circuitry 101). For example, in accordance with the calibration mode, the value of the second delay may be determined in accordance with the following Equation 3:

$$\Delta t_b = \frac{K}{V_{dd} - V_{ref}}. \quad (3)$$

In some examples, the first PVDL 106 and the second PVDL 108 may be configured to output the first delay signal 110 and the second delay signal 112, respectively, to a phase detector 114. For example, the phase detector 114 may be configured to receive the first delay signal 110 and the second delay signal 112 and output a first one or more command signals to a counter 120. As illustrated in the example of FIGS. 1A and 1B, the phase detector 114 may be configured to output a first control signal 116 (and 'Up' signal) and/or a second control signal 118 (a 'Dn' signal).

The counter may increment or decrement the 'counts' value of the counter based on the oner more first command signals. The counter 120 may be configured to receive the one or more first command signals and output one or more counter signals that represent an integer 'counts' value. As illustrated in the example of FIGS. 1A and 1B, the counter 120 may be configured to output a counter signal 122. The integer 'counts' value may be based on the first one or more command signals. For example, the counter 120 may increment or decrement the 'counts' value of the counter based on the first one or more command signals.

The first one or more command signals may be based on a first time difference between the first delay and the second delay. For example, the source voltage 132 may be greater than the reference voltage 144 and, as such, the value of the first delay may be less than the value of the second delay. In some such examples, the phase detector 114 may detect that the value of the first delay is less than (e.g., shorter than) the value of the second delay. In other words, the phase detector 114 may determine that the first delay signal 110 is faster than the second delay signal 112. As such, the phase detector 114 may determine to increase the value of the first delay (e.g., to slow down the first delay signal 110.

To increase the value of the first delay the phase detector 114 may output the first one or more command signals to indicate, to the counter 120, to count forward. The counter 120 may be configured to adjust the count of the counter 120 in accordance with the first control signal 116 and the second control signal 118. For example, the counter 120 may increase the value of the counter based on the first one or more command signals indicating for the counter to count forward. The counter 120 may be configured to output the counter signal 122 to logic circuitry 124. The counter signal 122 may be indicative of a value of a count of the counter 120. For example, the counter signal 122 may include or be otherwise indicative of one or more bits that indicate the integer 'counts' value of the counter.

In some examples, to cause the counter 120 to count forward, the phase detector 114 may set the first control signal 116 (e.g., an 'Up' signal) to '1' and the second control signal 118 (e.g., a 'Dn' signal) to '0'. That is, the phase detector 114 may set the first control signal 116 (e.g., an 'Up' signal) to '1' and the second control signal 118 (e.g., a 'Dn' signal) to '0' to trigger the counter 120 to increment the count of the counter 120 by one (or another suitable value). Thus, in response to receiving the first control signal 116 and the second control signal 118, the counter 120 may increment the count of the counter 120 by one, such that the value of the counter may increase by one.

The counter 120 may be configured to output the counter signal 122 to the logic circuitry 124. In accordance with calibration mode, the logic circuitry 124 may be configured to output the counter signal 122 (or another signal indicative of the value of the counter 120) to the first PVDL 106. The first PVDL 106 may be configured to use the value of the counter 120 to determine the value of the first delay. That is, the first PVDL 106 may be configured to adjust the value of the first delay according to the value of the counter 120. For example, the first PVDL 106 may be configured to apply a quantity of clock cycles to the first delay and the quantity of clock cycles may be based on the value of the counter. Thus, in some examples, the first PVDL 106 may increase the value of the first delay by one clock cycle based on the counter 120 increasing the count of the counter 120 by one. In some such examples, the phase detector 114 and the counter 120 may be configured to increment (or decrement) the count of the counter until the value of the first delay is equal to the value of the second delay (e.g., until $\Delta t_a = \Delta t_b$). That is, the phase detector 114 may (iteratively) cause the counter 120 to increment (or decrement) the count of the counter 120 until the value of the first delay is equal (or approximately equal) to the value of the second delay.

As an illustrative example, an initial difference between the value of the first delay ($\Delta t_a$) and the value of the second delay ($\Delta t_b$) may be 1 second and each increment of the counter may cause the value of the first delay to increase by 1 millisecond (e.g., due to the period of the clock cycle being 1 millisecond). In such an example, the value of the first delay may be equal (e.g., approximately equal) to the value of the second delay when the value of the counter is 1000. For example, at a first time instance the counter signal 122 may indicate, to the first PVDL 106 that the value of the counter is 999. Accordingly, the first PVDL 106 may increase the value of the first delay by 999 clock cycles. In such an example, the phase detector 114 may determine that the adjusted value of the first delay is less than the value of the second delay and, as such, may cause the counter 120 to count forward (e.g., via the first control signal 116 and the second control signal 118), such that the value of the counter increases by one. At a second time instance (e.g., in a subsequent iteration), the counter signal 122 may indicate, to the first PVDL 106 that the value of the counter is 1000. Accordingly, the first PVDL 106 may increase the value of the first delay by 1000 clock cycles (or 1 second). In such an example, the phase detector 114 may determine that the value of the first delay is equal the value of the second delay. In other words, when the value of the counter is 1000, the first PVDL 106 may adjust the value of the first delay by 1000 clock cycles (or 1 second) and the phase detector 114 may determine that the adjusted value of the first delay is equal to the value of the second delay (e.g., may determine that the first delay signal 110 is in phase with the second delay signal 112).

In some examples, in response to determining that the value of the first delay is equal (or approximately equal) to the value of second delay, the phase detector 114 may refrain from triggering the counter 120 to count forward (or backwards), such that the count of the counter 120 remains at the previously indicated value (e.g., 1000). In other words, the phase detector 114 may refrain from triggering the counter 120 to count forward (or backwards), such that the count of the counter 120 remains the same and the value of first delay remains equal to the value of the second delay. The phase detector 114 may refrain from triggering the counter 120 to count forward (or backwards) by setting the first control signal 116 and the second control signal 118 to '0'. Alternatively, the phase detector 114 may refrain triggering the counter 120 to count forward (or backwards) by refraining from transmitting the first control signal 116 and/or the second control signal 118 to the counter 120. In other words, the counter 120 may refrain from adjusting the count of the counter 120 based on a lack of the first control signal 116 and/or the second control signal 118, or in response to the first control signal 116 and the second control signal 118 being set to '0'.

In some examples, the power conversion circuitry 101 may determine to store a value of the counter 120 in response to the counter 120 remaining at the same value for a duration. For example, in response to the count of the counter 120 remaining at a first value for a duration, the power conversion circuitry 101 may store the first value of the counter. As illustrated in the example of FIGS. 1A and 1B, the power conversion circuitry 101 may store the first value of the counter as the digital reference 130. In some examples, the power conversion circuitry 101 may use the digital reference 130 to maintain a consistent value of the output voltage 152. For example, the power conversion circuitry 101 may determine that the first value of the counter corresponds to a difference between the source voltage 132 and the reference voltage 144 based on the first delay signal 110 being in phase with the second delay signal 112 (e.g., and the count of the counter 120 remaining at the first value for a duration). In other words, the power conversion circuitry 101 may determine that the first value is representative of the reference voltage 144. As such, the power conversion circuitry 101 may store the first value as the digital reference 130. In the example of FIGS. 1A and 1B, the power conversion circuitry 101 may store the digital reference 130 in a register for the first PVDL 106. In some other examples, the power conversion circuitry 101 may store the digital reference 130 in another register and/or flash memory. In other words, the systems may include a storage element (e.g., a register and/or flash memory) configured to store the first value as the digital reference 130, such that the power conversion circuitry 101 may use the digital reference 130 to maintain the output voltage 152 (e.g., instead of using an analog reference voltage, such as the reference voltage 144).

By performing the calibration, the power conversion circuitry 101 may obtain a zero (or near-zero) time difference between the first delay signal 110 and the second delay signal 112 despite a voltage difference between the source voltage 132 and the reference voltage 144. In other words, by performing the calibration, the power conversion circuitry 101 may compensate for the difference between the source voltage 132 and the reference voltage 144 (e.g., may reach a locked state). Thus, by performing the calibration, the power conversion circuitry 101 may obtain the digital reference 130, which enables the power conversion circuitry to operate without the voltage reference circuitry 146. Thus, in some examples, once the power conversion circuitry 101 has obtained the digital reference 130 (e.g., a code corresponding to the reference voltage 144), the power conversion circuitry 101 may switch off (or otherwise disable) the voltage reference circuitry 146. For example, the power conversion circuitry 101 may be integrated into a device (e.g., microcontroller) with the voltage reference circuitry 146, such that the power conversion circuitry 101 may perform one or multiple calibrations. In such an example, in response to obtaining the digital reference 130, the power conversion circuitry 101 may disable the voltage reference circuitry 146. In other words, the power conversion circuitry 101 may be configured to disable the voltage reference circuitry 146 based on the adjusted first delay being equal to the second delay.

In some examples, at a time instance after disabling the voltage reference circuitry 146, the power conversion circuitry 101 may (re) enable the voltage reference circuitry 146. For example, the power conversion circuitry 101 may enable the voltage reference circuitry 146 based on the time instance satisfying a criterion. The time instance may satisfy the criterion by being a time instance at which the power conversion circuitry is configured (or otherwise triggered) to perform a calibration. For example, the time instance may be a time instances at which the power conversion circuitry 101 starts up (e.g., is initialized). Additionally, or alternatively, the time instance may be a threshold duration (e.g., 10 hours or another suitable value) after the start-up of the power conversion circuitry 101 and/or a previous calibration. For example, the time instance may be a time instances at which a timer corresponding to an operating time of the system expires.

In some examples, the time instance may be a time instance at which the power conversion circuitry is triggered to perform a calibration, for example, due to a reduction in performance. For example, at the time instance, the power conversion circuitry 101 (or a device including the power conversion circuitry 101) may detect a decrease in performance and, as such, may trigger the power conversion circuitry 101 to perform a calibration (e.g., to switch to the calibration mode).

In some other examples, one or more calibrations may be performed prior to integrating (e.g., embedding) the power conversion circuitry 101 into the device. For example, a user may perform one or more calibrations to obtain the digital reference 130 and, after obtaining the digital reference, the user may integrate the power conversion circuitry 101 (or a portion thereof) into the device, such that the device may lack the voltage reference circuitry 146.

In some examples, the power conversion circuitry 101 may be configured to operate in accordance with a regulation mode. For example, the power conversion circuitry 101 may be configured to switch from the calibration mode to the regulation mode. In some examples, the power conversion circuitry 101 may be configured to (autonomously) switch from the calibration mode to the regulation mode based on the first value of the counter 120 satisfying a criterion. The first value of the counter 120 may satisfy the criterion by being maintained at the counter 120 for a duration. Additionally, or alternatively, the first value of the counter may satisfy the criterion by being output by the counter multiple times. In other words, the power conversion circuitry 101 may determine that the first value satisfies the criterion based on the count of the counter remaining at the first value for a threshold duration. In some other examples, the power conversion circuitry 101 may be configured to operate in the regulation mode after being integrated into the device (e.g., without the voltage reference circuitry 146).

In some examples, in accordance with the regulation mode, the CM signal 126, which is provided to the multiplexer 140 and the logic circuitry 124, may be set to '0'. By setting the CM signal 126 to '0', the multiplexer 140 may be configured to output a feedback voltage 154 ($V_{fb}$), which corresponds to the output voltage 152 provided to the load 156 or the load 158. That is, the feedback voltage 154 may be or may be otherwise indicative of the output voltage 152. Thus, in accordance with the regulation mode, the control voltage 138 is equal to the feedback voltage 154. Accordingly, the second PVDL 108 may be configured to output the second delay signal 112 with a delay that is based on the output voltage 152. Thus, in accordance with the regulation mode, a value of the second delay ($\Delta t_b$) may be determined in accordance with the following Equation 4

$$\Delta t_b = \frac{K}{V_{dd} - V_{fb}}. \tag{4}$$

In some such examples, in accordance with the regulation mode, the first PVDL 106 is configured to apply the digital reference 130 to the first delay signal 110, such that the first delay signal 110 has a delay that is based on the analog reference voltage (e.g., the reference voltage 144 ($V_{ref}$)). Thus, in accordance with the regulation mode, a value of the first delay ($\Delta t_a$) may be determined in accordance with the following Equation 5:

$$\Delta t_a = \frac{K}{V_{dd} - V_{ref}}. \tag{5}$$

The first PVDL 106 and the second PVDL 108 may be configured to output the first delay signal 110 and the second delay signal 112, respectively, to the phase detector 114. For example, the phase detector 114 may be configured to receive the first delay signal 110 and the second delay signal 112 and output a second one or more command signals (e.g., a second one or more values of the first control signal 116 and the second control signal 118) to the counter 120. The second one or more command signals may be based on a second time difference between the value of the first delay and the value of the second delay, where the second time difference corresponds to a voltage difference between the reference voltage 144 and the feedback voltage 154 (and thus the output voltage 152). The counter 120 may be configured to receive the second one or more command signals and output the counter signal 122, where the counter signal 122 is indicative of the value of the count of the counter.

In some examples, such as examples in which the feedback voltage 154 is different from the reference voltage 144, the value of the first delay may deviate from the value of the second delay. In some such examples, the phase detector 114 may determine to increase or decrease a number of active pass transistors included in the transistor circuitry 150. In other words, in accordance with the regulation mode, the power conversion circuitry 101 may adjust the number of active pass transistors to maintain (e.g., keep) the feedback voltage 154 equal to the reference voltage 144 and, as such, the value of the first delay equal to the value of the second delay.

For example, the phase detector 114 may output the first control signal 116 (e.g., an 'Up' signal) and/or the second control signal 118 (e.g., a 'Dn' signal) to trigger the counter 120 to increment or decrement the count of the counter 120 by one (or another suitable value). In response to receiving the first control signal 116 and/or the second control signal 118, the counter 120 may increment or decrement the count of the counter 120 by one, such that the value of the counter may increase or decrease by one. That is, the counter 120 may be configured to adjust the count of the counter 120 in accordance with the first control signal 116 and/or the second control signal 118.

The counter 120 may be configured to output the counter signal 122 to the logic circuitry 124. In accordance with the regulation mode, and based on the CM signal 126 being set to '0', the logic circuitry 124 may output the counter signal 122 to the transistor circuitry 150. The counter signal 122 may be indicative of the value of the counter. The transistor circuitry 150 may be configured to use the value of the counter 120 to determine a number (e.g., quantity) of pass transistors included in the transistor circuitry 150 to activate. That is, the transistor circuitry 150 may be configured to adjust the number of active pass transistors according to the value of the counter 120. By adjusting the number of active pass transistors, the power conversion circuitry 101 may adjust the value of the output voltage 152. For example, the transistor circuitry 150 may be configured to decrease the number of active pass transistors by one in response to the count of the counter 120 increasing by one. In such an example, decreasing the number of active pass transistors may decrease the value of the output voltage 152. In some other examples, the transistor circuitry 150 may be configured to increase the number of active pass transistors by one in response to the count of the counter 120 decreasing by one. In some such examples, the increasing the number of active pass transistors may increase the value of the output voltage 152.

In some examples, the feedback voltage 154 may be higher than the reference voltage 144. For example, the load 156 or the load 158 may decrease (e.g., be relatively light), which may lead to the feedback voltage 154 being higher than the reference voltage 144. In some such examples, the phase detector 114 may determine that the value of the first delay is less than the value of the second delay. As such, the phase detector 114 may trigger the counter 120 to go up in count. For example, the phase detector 114 may set the first control signal 116 to '1' and/or the second control signal 118 to '0', such that the counter 120 counts forward, thereby increasing the value of the count of the counter 120. According, the counter signal 122, which the logic circuitry 124 may output to the transistor circuitry 150, may trigger the transistor circuitry 150 to decrease the number of active pass transistors, thereby decreasing the output voltage 152.

In some other examples, the feedback voltage 154 may be lower than the reference voltage 144. For example, the load 156 or the load 158 may increase (e.g., may be overloaded), which may lead to the feedback voltage 154 being lower than the reference voltage 144. In some such examples, the phase detector 114 may determine that the value of the first delay is greater than the value of the second delay and, as such, may trigger the counter 120 to go down in count. For example, the phase detector 114 may set the first control signal 116 to '0' and/or the second control signal 118 to '1', such that the counter 120 counts backward, thereby decreasing the value of the count of the counter 120. According, the counter signal 122, which the logic circuitry 124 may output to the transistor circuitry 150, may trigger the transistor circuitry 150 to increase the number of active pass transistors, thereby increasing the output voltage 152. In some such examples, the phase detector 114 and the counter 120 may be configured to (continue to) increment or decrement the count of the counter 120 until the first delay signal 110 is in phase with the second delay signal 112. That is, the phase detector 114 may (iteratively) cause the counter 120 to increment or decrement the count of the counter 120 until the value of the first delay is equal (or approximately equal) to the value of the second delay (e.g., until $V_{fb}=V_{ref}$). In some examples, by using the digital reference 130 to determine the first delay, the power conversion circuitry 101 may refrain from using an analog voltage reference (e.g., may operate in the time domain), which may result in a more efficient and effective circuit design in challenging environments, such as in low- or ultra-low power applications.

FIG. 2 illustrates a flowchart 200 of operations that support systems and methods for a time domain voltage reference with zero quiescent current consumption in accordance with one or more embodiments of the present disclosure. The operations of the flowchart 200 may be implemented in a system, such as a system illustrated by and described with reference to FIGS. 1A and 1B.

At operation 202, the system may output, via a first PVDL, a first delay signal having a first delay that is based at least in part on an input voltage for a system. In other words, the system may include a first PVDL line configured to output a first delay signal having a first delay that is based at least in part on an input voltage for the system. The first PVDL may be an example of a first PVDL 106 illustrated by and described with reference to FIGS. 1A and 1B. For example, in accordance with a calibration mode, the first delay signal may have a delay that is inversely proportional to the source voltage (e.g., $\Delta t_a=K/V_{dd}$).

At operation 204, the system may output, via a second PVDL, a second delay signal having a second delay that is based at least in part on a first voltage difference between the input voltage and an analog reference voltage for the system. In other words, the system may include a second PVDL configured to output a second delay signal having a second delay that is based at least in part on a first voltage difference between the input voltage and an analog reference voltage for the system. The second PVDL may be an example of a second PVDL 108 illustrated by and described with reference to FIGS. 1A and 1B. For example, in accordance with the calibration mode, the second delay signal may have a delay that is inversely proportional to the difference between the source voltage and the reference voltage (e.g., $\Delta t_b=K/(V_{dd}-V_{ref})$).

At operation 206, the system may output, via a phase detector configured to receive the first delay signal and the second delay signal, a first one or more command signals that are based at least in part on a first time difference between the first delay and the second delay, wherein the first time difference corresponds to the first voltage difference. In other words, the system may include a phase detector configured to receive the first delay signal and the second delay signal and output a first one or more command signals based at least in part on a first time difference between the first delay and the second delay, wherein the first time difference corresponds to the first voltage difference. The phase detector may be an example of a phase detector 114 illustrated by and described with reference to FIGS. 1A and 1B. For example, the phase detector may be configured to detect a delay difference between $\Delta t_a$ and $\Delta t_b$ (and thus a voltage difference between $V_{dd}$ and $V_{ref}$) and, in combination with a counter, convert the delay difference into a digital reference.

At operation 208, the system may output, via a counter configured to receive the first one or more command signals, a first counter signal indicative of a first value of a count of the counter, wherein the first value is based at least in part on the first one or more command signals. In other words, the system may include a counter configured to receive the first one or more command signals and output a first counter signal indicative of a first value of a count of the counter, wherein the first value is based at least in part on the first one or more command signals. In other words, the counter may be configured to digitize an initial delay difference between $\Delta t_a$ and $\Delta t_b$ (and thus the voltage difference between $V_{dd}$ and $V_{ref}$). The counter may be an example of a counter 120 illustrated by and described with reference to FIGS. 1A and 1B. For example, the counter may be configured to output the counter signal to logic circuitry.

At operation 210, the system may store the first value via a storage element, wherein the system (e.g., the first PVDL included in the system) is configured to use the first value as a digital reference corresponding to the analog reference voltage. In other words, the system may include a storage element configured to store the first value, wherein the system is configured to use the first value as a digital reference corresponding to the analog reference voltage. That is, the system may create a digital reference that may be used to regulate the output voltage of the system (e.g., may replace the analog voltage reference). The storage element may be an example of register, such as register for the first PVDL 106 illustrated by and described with reference to FIGS. 1A and 1B. Alternatively, the storage element may be an example of flash memory. The systems, apparatuses, and methods of the present disclosure may provide for a more efficient and effective circuit designs in low voltage environments.

FIG. 3 illustrates an exemplary device 300 that support systems and methods for a time domain voltage reference with zero quiescent current consumption in accordance with one or more embodiments of the present disclosure. FIG. 3 may be implemented by one or more aspects illustrated by and described with reference to FIGS. 1A, 1B, and 2. The device 300 may be a device for an application, apparatus, and/or a system. For example, the device 300 may be a device for a low-power device, such as a wakeup radio, which may consume a relatively small amount of power. The device 300 may be a device for power conversion applications, or for a device for another application that uses a power converter. For example, the device 300 may be a device for a system illustrated by and described with reference to FIGS. 1A and/or 1B. In some examples, the device may be an example of a voltage regulator, a DC-DC converter, an SMPS, or a device that uses a voltage regulator, a DC-DC converter, or an SMPS.

The device 300 may be a system and/or apparatus that includes a processor 302, memory 304, communication circuitry 306, input/output circuitry 308, and power conversion circuitry 310, and all of which may be connected by a bus or buses 312. It should be appreciated that, in some embodiments, the device 300 may include or be otherwise coupled to one or more other components, such as a power source(s) and/or a load(s). The power source(s) and/or a load(s) may be internal or external to the device 300. For example, a power source may be coupled to the power conversion circuitry 310 via a bus or one or more connectors. Additionally, or alternatively, a load may be coupled to the power conversion circuitry 310 via a bus or one or more connectors.

The processor 302, although illustrated as a single block, may be comprised of a plurality of components and/or processor circuitry. The processor 302 may be implemented as, for example, various components comprising one or a plurality of microprocessors with accompanying digital signal processors; one or a plurality of processors without accompanying digital signal processors; one or a plurality of coprocessors; one or a plurality of multi-core processors; processing circuits; and various other processing elements. The processor may include integrated circuits. In various embodiments, the processor 302 may be configured to execute applications, instructions, and/or programs stored in the processor 302, or otherwise accessible to the processor 302. When executed by the processor 302, these applications, instructions, and/or programs may enable the execution of one or a plurality of the operations and/or functions described herein. Regardless of whether it is configured by hardware, firmware/software methods, or a combination thereof, the processor 302 may comprise entities capable of executing operations and/or functions according to the embodiments of the present disclosure when correspondingly configured. For example, the processor 302 may be configured to cause power conversion circuitry 310 to store a value of a counter (e.g., included in counter circuitry 318) as a digital reference and/or switch from a calibration mode to regulation mode. In some examples, the processor 302 may be configured to cause the power conversion circuitry 310 to enable or disable voltage reference circuitry.

The memory 304 may comprise, for example, a volatile memory, a non-volatile memory, or a certain combination thereof. Although illustrated as a single block, the memory 304 may comprise a plurality of memory components. In various embodiments, the memory 304 may comprise, for example, a random access memory, a cache memory, a flash memory, a hard disk, a circuit configured to store information, or a combination thereof. The memory 304 may be configured to write or store data, information, application programs, instructions, etc. so that the processor 302 may execute various operations and/or functions according to the embodiments of the present disclosure. For example, in at least some embodiments, a memory 304 may be configured to buffer or cache data for processing by the processor 302. Additionally, or alternatively, in at least some embodiments, the memory 304 may be configured to store program instructions for execution by the processor 302. The memory 304 may store information in the form of static and/or dynamic information. When the operations and/or functions are executed, the stored information may be stored and/or used by the processor 302. In some examples, the memory may be configured to store one or more values of the counter, which may be used by the power conversion circuitry 310 as a digital reference corresponding to an analog reference voltage (e.g., provided by voltage reference circuitry).

The communication circuitry 306 may be implemented as a circuit, hardware, computer program product, or a combination thereof, which is configured to receive and/or transmit data from/to another component or apparatus. The computer program product may use computer-readable program instructions stored on a computer-readable medium (e.g., memory) and executed by a processor 302. In various embodiments, the communication circuitry 306 (as with other components discussed herein) may be at least partially implemented as part of the processor 302 or otherwise controlled by the processor 302. The communication circuitry 306 may communicate with the processor 302, for example, through a bus 312. Such a bus 312 may connect to the processor 302, and it may also connect to one or more other components of the processor 302. The communication circuitry 306 may be comprised of, for example, transmitters, receivers, transceivers, network interface cards and/or supporting hardware and/or firmware/software and may be used for establishing communication with another component(s), apparatus(es), and/or system(s). The communication circuitry 306 may be configured to receive and/or transmit data that may be stored by memory by using one or more protocols that can be used for communication between components, apparatuses, and/or systems.

The input/output circuitry 308 may communicate with the processor 302 to receive instructions input by an operator and/or to provide audible, visual, mechanical, or other outputs to an operator. The input/output circuitry 308 may comprise supporting devices, such as a keyboard, a mouse, a user interface, a display, a touch screen display, lights (e.g., warning lights), indicators, speakers, and/or other input/output mechanisms. The input/output circuitry 308 may comprise one or more interfaces to which supporting devices may be connected. In various embodiments, aspects of the input/output circuitry 308 may be implemented on a device used by the operator to communicate with the processor 302. The input/output circuitry 308 may communicate with memory, the communication circuitry 306, and/or any other component, for example, through a bus 312.

The power conversion circuitry 310 may be an example of a system, or a portion thereof, illustrated by and described with reference to at least FIGS. 1A and 1B. For example, the power conversion circuitry 310 may include PVDL circuitry 314, which may be an example of (or otherwise include) a first PVDL 106 and/or a second PVDL 108 illustrated by and described with reference to FIGS. 1A and 1B. For example, the PVDL circuitry 314 may be configured to output a first delay signal having a first delay that is based on an input voltage for the device 300. Additionally, the PVDL circuitry 314 may be configured to output a second delay signal having a second delay that is based on a first voltage difference between the input voltage and an analog reference voltage for the device 300.

The power conversion circuitry 310 may include phase detector circuitry 316, which may be an example of (or otherwise include) a phase detector 114 illustrated by and described with reference to FIGS. 1A and 1B. For example, the phase detector circuitry 316 may be configured to receive the first delay signal and the second delay signal and output a first one or more command signals that are based on a first time difference between the first delay and the second delay. In such an example, the first time difference corresponds to the first voltage difference.

The power conversion circuitry 310 may further include the counter circuitry 318, which may be an example of (or otherwise include) a counter 120 illustrated by and described with reference to FIGS. 1A and 1B. For example, the counter circuitry 318 may be configured to receive the first one or more command signals and output a first counter signal indicative of a first value of a count of the counter. In such an example, the first value is based on the first one or more command signals. In some examples, the PVDL circuitry 314 is configured to store the first value, such that the power conversion circuitry 310 may use the first value as a digital reference corresponding to the analog reference voltage. In some other examples, the memory 304 is configured to store the first value and provide the first value to the PVDL circuitry 314.

The device 300 may be implemented in hardware, software, or a combination of hardware and software. In various embodiments, the device 300, or portions thereof, may be embodied in an integrated circuit, a microcontroller unit (MCU) (e.g., virtual machine running in an MCU), and/or the like. It should be readily appreciated that the embodiments of the systems, apparatuses, and methods described herein may be configured in various additional and alternative manners in addition to those expressly described herein.

CONCLUSION

Operations and/or functions of the present disclosure have been described herein, such as in flowcharts. As will be appreciated, computer program instructions may be loaded onto a computer or other programmable apparatus (e.g., hardware) to produce a machine, such that the resulting computer or other programmable apparatus implements the operations and/or functions described in the flowchart blocks herein. These computer program instructions may also be stored in a computer-readable memory that may direct a computer, processor, or other programmable apparatus to operate and/or function in a particular manner, such that the instructions stored in the computer-readable memory produce an article of manufacture, the execution of which implements the operations and/or functions described in the flowchart blocks. The computer program instructions may also be loaded onto a computer, processor, or other programmable apparatus to cause a series of operations to be performed on the computer, processor, or other programmable apparatus to produce a computer-implemented process such that the instructions executed on the computer, processor, or other programmable apparatus provide operations for implementing the functions and/or operations specified in the flowchart blocks. The flowchart blocks support combinations of means for performing the specified operations and/or functions and combinations of operations and/or functions for performing the specified operations and/or functions. It will be understood that one or more blocks of the flowcharts, and combinations of blocks in the flowcharts, can be implemented by special purpose hardware-based computer systems which perform the specified operations and/or functions, or combinations of special purpose hardware with computer instructions.

While this specification contains many specific embodiments and implementation details, these should not be construed as limitations on the scope of any disclosures or of what may be claimed, but rather as descriptions of features specific to particular embodiments of particular disclosures. Certain features that are described herein in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

While operations and/or functions are illustrated in the drawings in a particular order, this should not be understood as requiring that such operations and/or functions be performed in the particular order shown or in sequential order, or that all illustrated operations be performed, to achieve desirable results. In certain circumstances, operations and/or functions in alternative ordering may be advantageous. In some cases, the actions recited in the claims may be performed in a different order and still achieve desirable results. Thus, while particular embodiments of the subject matter have been described, other embodiments are within the scope of the following claims.

While this detailed description has set forth some embodiments of the present disclosure, the appended claims cover other embodiments of the present disclosure which differ from the described embodiments according to various modifications and improvements.

Within the appended claims, unless the specific term "means for" or "step for" is used within a given claim, it is not intended that the claim be interpreted under 35 U.S.C. § 112, paragraph 6.

The invention claimed is:

1. A system, comprising:

a first programmable voltage delay line configured to output a first delay signal having a first delay that is based at least in part on an input voltage for the system;

a second programmable voltage delay line configured to output a second delay signal having a second delay that is based at least in part on a first voltage difference between the input voltage and an analog reference voltage for the system;

a phase detector configured to receive the first delay signal and the second delay signal and output a first one or more command signals based at least in part on a first time difference between the first delay and the second delay, wherein the first time difference corresponds to the first voltage difference;

a counter configured to receive the first one or more command signals and output a first counter signal indicative of a first value of a count of the counter, wherein the first value is based at least in part on the first one or more command signals; and a storage element configured to store the first value, wherein the first programmable voltage delay line is configured to use the stored first value as a digital reference corresponding to the analog reference voltage.

2. The system of claim 1, wherein the first programmable voltage delay line is configured to adjust the first delay in accordance with the first value, and wherein the storage element is configured to store the first value based at least in part on the adjusted first delay being equal to the second delay.

3. The system of claim 2, wherein the system comprises voltage reference circuitry configured to provide the analog reference voltage for the system, and wherein the system is configured to disable the voltage reference circuitry based at least in part on the adjusted first delay being equal to the second delay.

4. The system of claim 3, wherein, at a time instance after disabling the voltage reference circuitry, the system is configured to enable the voltage reference circuitry based at least in part on the time instance satisfying a criterion.

5. The system of claim 2, wherein the counter is configured to adjust the count of the counter in accordance with the first one or more command signals, and wherein the first value is based at least in part on one or more adjustments to the count of the counter.

6. The system of claim 1, wherein the system comprises pass transistor circuitry configured to control an output voltage of the system, wherein the system is configured to provide one or more values of the counter to the pass transistor circuitry for controlling the output voltage based at least in part on the system operating in accordance with a regulation mode, and wherein the one or more values includes at least the first value.

7. The system of claim 6, wherein, in accordance with the regulation mode:

the first programmable voltage delay line is configured to apply the digital reference to output a third delay signal having a third delay that is based at least in part on the analog reference voltage;

the second programmable voltage delay line is configured to output a fourth delay signal having a fourth delay that is based at least in part on the output voltage;

the phase detector is configured to receive the third delay signal and the fourth delay signal and output a second one or more command signals based at least in part on a second time difference between the third delay and the fourth delay, wherein the second time difference corresponds to a second voltage difference between the analog reference voltage and the output voltage;

the counter is configured to receive the second one or more command signals and output a second counter signal indicative of a second value of the count of the counter, wherein the second value is based at least in part on the second one or more command signals; and the pass transistor circuitry is configured to activate a number of pass transistors included in the pass transistor circuitry in accordance with the second value, wherein the output voltage is based at least in part on the number of active pass transistors.

8. The system of claim 6, wherein the system is configured to provide a first one or more values of the counter to the first programmable voltage delay line to control the first delay based at least in part on the system operating in accordance with a calibration mode, wherein the first one or more values includes at least the first value, and wherein the system is configured to switch from the calibration mode to the regulation mode based at least in part on the first value satisfying a criterion.

9. The system of claim 1, wherein the system further comprises:

a first n-channel metal-oxide-semiconductor transistor configured to provide a first voltage signal to the first programmable voltage delay line; wherein the first voltage signal is indicative of the input voltage; and a second n-channel metal-oxide-semiconductor transistor configured to provide a second voltage signal to the second programmable voltage delay line, wherein the second voltage signal is indicative of the first voltage difference.

10. The system of claim 1, wherein the storage element comprises a register or flash memory.

11. The system of claim 1, wherein the system comprises a voltage regulator, a direct current-to-direct current converter, or a switch mode power supply.

12. A method comprising:

outputting, via a first programmable voltage delay line, a first delay signal having a first delay that is based at least in part on an input voltage for a system;

outputting, via a second programmable voltage delay line, a second delay signal having a second delay that is based at least in part on a first voltage difference between the input voltage and an analog reference voltage for the system;

outputting, via a phase detector configured to receive the first delay signal and the second delay signal, a first one or more command signals that are based at least in part on a first time difference between the first delay and the second delay, wherein the first time difference corresponds to the first voltage difference;

outputting, via a counter configured to receive the first one or more command signals, a first counter signal indicative of a first value of a count of the counter, wherein the first value is based at least in part on the first one or more command signals; and storing the first value via a storage element, wherein the first programmable voltage delay line is configured to use the stored first value as a digital reference corresponding to the analog reference voltage.

13. The method of claim 12, further comprising:

adjusting, via the first programmable voltage delay line, the first delay in accordance with the first value, wherein storing the first value is based at least in part on the adjusted first delay being equal to the second delay.

14. The method of claim 13, further comprising:

providing the analog reference voltage via a voltage reference circuitry; and disabling the voltage reference circuitry based at least in part on the adjusted first delay being equal to the second delay.

15. The method of claim 14, further comprising:

enabling the voltage reference circuitry at a time instance after disabling the voltage reference circuitry based at least in part on the time instance satisfying a criterion.

16. The method of claim 13, further comprising:

adjusting the count of the counter in accordance with the first one or more command signals, wherein the first value is based at least in part on one or more adjustments to the count of the counter.

17. The method of claim 12, further comprising:

outputting, based at least in part on the system operating in accordance with a regulation mode, one or more values of the counter to pass transistor circuitry for controlling an output voltage, wherein the one or more values includes at least the first value.

18. The method of claim 17, further comprising:

outputting, via the first programmable voltage delay line, a third delay signal having a third delay that is based at least in part on the analog reference voltage;

outputting, via the second programmable voltage delay line, a fourth delay signal having a fourth delay that is based at least in part on the output voltage;

outputting, via the phase detector, a second one or more command signals that are based at least in part on a second time difference between the third delay and the fourth delay, wherein the second time difference corresponds to a second voltage difference between the analog reference voltage and the output voltage;

outputting, to the pass transistor circuitry via the counter, a second counter signal indicative of a second value of the count of the counter, wherein the second value is based at least in part on the second one or more command signals; and activating, via the pass transistor circuitry, a number of pass transistors in accordance with the second value, wherein the output voltage is based at least in part on the number of active pass transistors.

19. The method of claim 18, further comprising:

outputting, based at least in part on the system operating in accordance with a calibration mode, a first one or more values of the counter to the first programmable voltage delay line to control the first delay, wherein the first one or more values includes at least the first value; and switching from the calibration mode to the regulation mode based at least in part on the first value satisfying a criterion.

20. The method of claim 12, further comprising:

outputting, via a first n-channel metal-oxide-semiconductor transistor, a first voltage signal to the first programmable voltage delay line, wherein the first voltage signal is indicative of the input voltage; and outputting, via a second n-channel metal-oxide-semiconductor transistor, a second voltage signal to the second programmable voltage delay line, wherein the second voltage signal is indicative of the first voltage difference.

* * * * *